United States Patent
Berlin et al.

(10) Patent No.: US 6,374,677 B1
(45) Date of Patent: Apr. 23, 2002

(54) MICROMECHANICAL DISCRETE TIME AND FREQUENCY CHARACTERIZATION OF SIGNALS VIA RESONATOR CLAMPING AND MOTION-ARRESTING MECHANISMS

(75) Inventors: Andrew A. Berlin, San Jose; Elmer S. Hung, Foster City; Feng Zhao, Campbell, all of CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/510,367

(22) Filed: Feb. 22, 2000

(51) Int. Cl.⁷ .................................................. G01M 7/00
(52) U.S. Cl. ....................................................... 73/662
(58) Field of Search ............................... 73/651, 514.14, 73/514.29, 514.17, 514.18, 514.15, 504.16, 504.15, 579, 662; 334/154, 156; 368/155, 160, 167

(56) References Cited

U.S. PATENT DOCUMENTS

| | | | | |
|---|---|---|---|---|
| 4,942,620 A | * | 7/1990 | Nevill, Jr. ..................... | 73/651 |
| 5,001,933 A | * | 3/1991 | Brand ........................... | 73/651 |
| 5,036,705 A | * | 8/1991 | Gaines ......................... | 73/514.14 |
| 5,596,144 A | * | 1/1997 | Swanson ........................ | 73/514.18 |
| 5,852,242 A | * | 12/1998 | Devolk et al. ................ | 73/514.17 |
| 5,914,553 A | * | 6/1999 | Adams et al. ................. | 310/309 |
| 6,130,464 A | * | 10/2000 | Carr ........................... | 257/417 |
| 6,238,946 B1 | * | 5/2001 | Ziegler ........................ | 438/50 |

\* cited by examiner

*Primary Examiner*—Richard A. Moller
(74) *Attorney, Agent, or Firm*—Finnegan, Henderson, Farabow, Garrett & Dunner, LLP

(57) ABSTRACT

A micromechanical resonator including a motion arresting mechanism to rapidly damp the vibration of a resonator beginning at any given moment in time to remove vibration caused by previous events. An electrostatic clamp uses a bias voltage between an electrode and the resonator to damp the resonator and return it to its equilibrium position. A mechanical clamp includes an actuator that forces the mechanical clamp to contact the resonator. These micromechanical resonators facilitate condition based monitoring of complex electromechanical machines and components by allowing signature analysis in multiple temporal and frequency domains.

26 Claims, 5 Drawing Sheets

MICROMECHANICAL DISCRETE TIME AND FREQUENCY CHARACTERIZATION OF SIGNALS VIA RESONATOR CLAMPING AND MOTION-ARRESTING MECHANISMS

FIELD OF THE INVENTION

The present invention relates generally to the field of signal analysis, and more particularly to a micromechanical resonator that allows signal detection in multiple time and frequency domains.

BACKGROUND OF THE INVENTION

Future electro-mechanical machines and structures will increasingly participate in their own service and maintenance using embedded distributed self-diagnostics that are remotely accessible to monitor machine health, detect and isolate subtle performance degradation, and in some cases even reconfigure some machines to adapt to changing operating environments. Traditionally, corrective maintenance and preventative maintenance have been the only two service paradigms. More recently, predictive or condition-based maintenance using micromechanical resonators, enabled by Micro-Electro-Mechanical Systems (MEMS) technology is emerging as an alternative. Condition-based maintenance is just-in-time maintenance based on the actual health of the machine and its components. Since it avoids the cumulative cost of unnecessary service calls associated with preventative maintenance and the occurrence of machine failure and degradation associated with corrective maintenance, condition-based maintenance provides substantial cost savings.

Fault manifestation in electro-mechanical systems with multiple moving elements in complex operating regimes, however, is typically non-stationary in that the frequencies describing specific faults vary over time. The multiple actuating elements such as motors and solenoids produce rich mechanical excitation signals at multiple time and frequency domains. Traditional Fourier spectral analysis techniques, such as the Fourier transform, while useful for establishing the signal bandwidth, is unsuitable for analyzing the time-varying properties of the signal that are important for diagnosis purposes. Another problem is that failure modes of system components are difficult to identify and characterize using time-based or frequency-based analysis. Hence, signature analysis with a time-frequency representation, such as that provided by the short-time Fourier transform (STFT) is required for condition monitoring of these systems.

A conventional micromechanical resonator for signature analysis is an array of tuning forks. Each tuning fork of the array resonates at a particular frequency while being insensitive to other frequencies. Thus, the entire spectral content of a vibration signal can be covered using a large number of tuning forks with closely spaced resonant frequencies. As shown in FIG. 1, array 10 includes higher frequency tuning forks 12, mid frequency tuning forks 14, and lower frequency tuning forks 16. Conventional arrays typically use a gas to damp out resonant vibration of the tuning forks.

Conventional micromechanical resonators provide frequency information, but do not provide the ability to separate this information into specific time intervals or windows of constant length. These tuning fork arrays, however, suffer from two problems. First, the duration of the time interval is limited by the viscous properties of the damping gas. Since elements that move faster will damp out sooner, the duration of time intervals is frequency dependent and varies for different frequency tuning forks. Thus, the amount of damping that may be employed will be limited by the sensitivity of the high frequency components. This affects the ability of the low frequency tuning forks to distinguish new events from old events in situations in which the new event occurs before the old event has been damped out. Second, some condition-based maintenance algorithms, such as short-time Fourier transform, require all the tuning forks to be damped simultaneously while others, such as wavelet transformation, require a hierarchy of time intervals between damping. Conventional tuning fork arrays, however, do not provide this capability.

In light of the foregoing, there is a need for a method and a micromechanical resonator for arresting the motion of micromechanical resonators to allow detection of rich electromechanical excitation signals at multiple time and frequency domains.

SUMMARY OF THE INVENTION

Accordingly, the present invention is directed to an micromechanical resonator that substantially obviates one or more of the problems due to limitations and disadvantages of the related art.

In accordance with the purposes of the present invention, as embodied and broadly described, the invention provides a micromechanical resonator including at least one resonant mass having an equilibrium position, at least one anchor electrode that provides electrostatic damping of the resonant mass, and a substrate having a planar surface.

In another embodiment, the present invention provides a micromechanical resonator including at least one resonant mass having an equilibrium position, a clamp, wherein the clamp provides mechanical clamping of the resonant mass, and a actuator for applying the clamp.

In another embodiment, the present invention provides an array of micromechanical resonators including a plurality of resonant masses and a plurality of mechanisms to damp the resonant masses, wherein the damping mechanisms are simultaneously activated to allow the array to measure discrete time intervals.

In another embodiment, the invention provides an array of micromechanical resonators including a plurality of resonant masses and a plurality of mechanisms to clamp the resonant masses, wherein the clamping mechanisms are configured to allow the array to measure a hierarchy of time intervals.

In yet another embodiment, the invention provides a method of clamping and releasing a mechanical sensor including the steps of measuring the frequency of an event for an initial time interval using a resonant mass having an equilibrium position, clamping the resonant mass, and releasing the resonant mass in its equilibrium position to measure a second time interval.

The accompanying drawings are included to provide a further understanding of the invention and are incorporated in and constitute a part of this specification, illustrate several embodiments of the invention and together with the description serve to explain the principles of the invention.

BRIEF DESCRIPTION OF THE DRAWINGS

The accompanying drawings, which are incorporated in and constitute a part of this specification, illustrate an embodiment of the invention and, together with the description, serve to explain the objects, advantages, and principles of the invention.

DETAILED DESCRIPTION OF THE PREFERRED EMBODIMENTS

Reference will now be made in detail to the preferred embodiments of the invention, examples of which are illustrated in the accompanying drawings.

Figure 1:
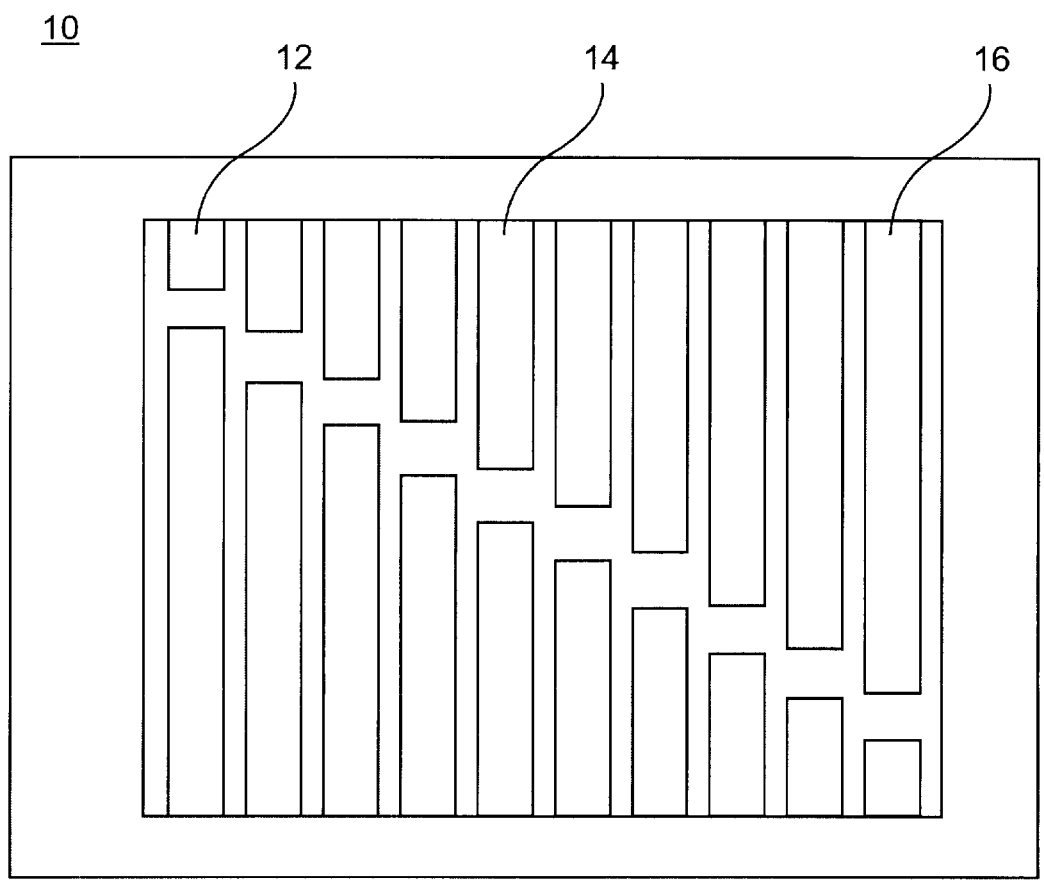
FIG. 1 is schematic drawing of a prior art micromechanical resonator consisting of a tuning fork array.
Figure 2A:
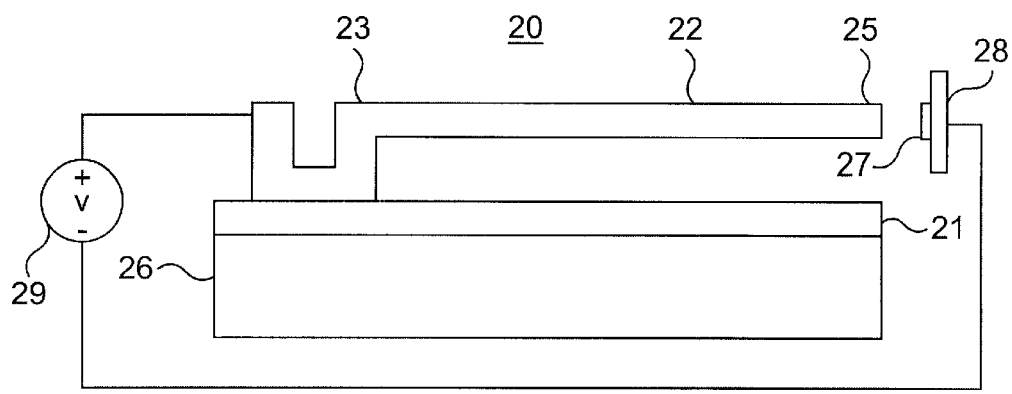
FIG. 2A is a schematic side view of a micromechanical resonator with an electrostatic clamp according to one exemplary embodiment of the present invention.
Figure 2B:
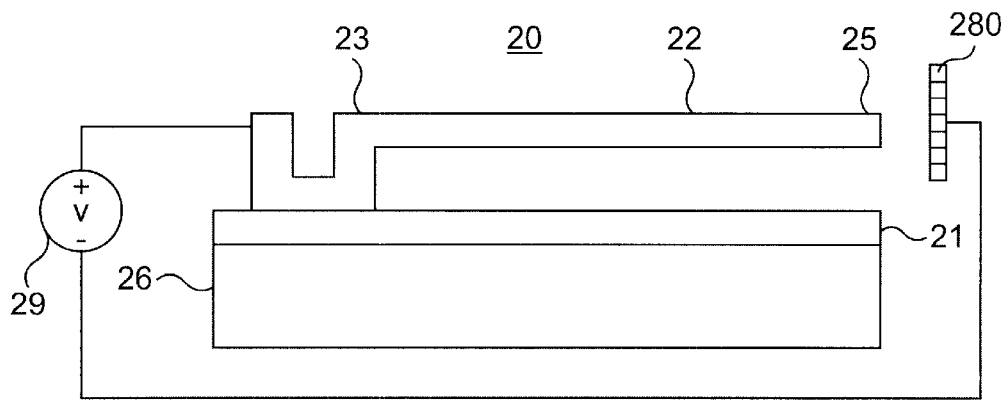
FIG. 2B is a schematic side view of a micromechanical resonator with a segmented electrode according to one exemplary embodiment of the present invention.
Figure 2C:
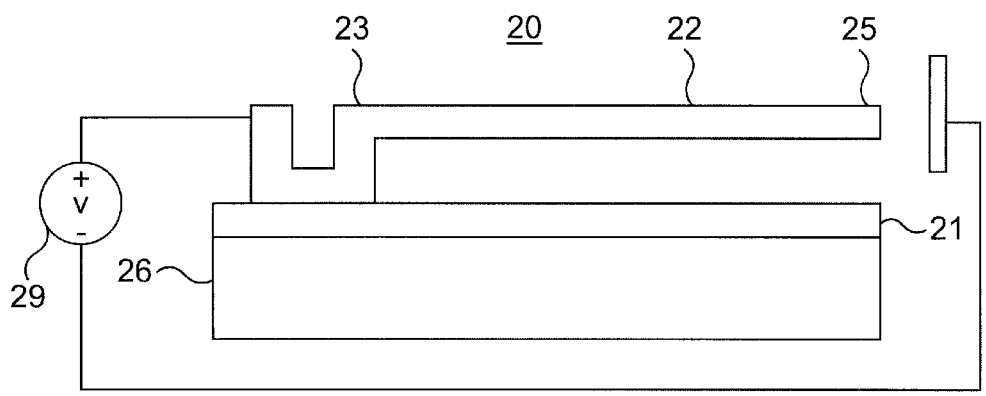
FIG. 2C is a schematic top view of a micromechanical resonator wherein the resonator oscillates parallel to the substrate according to one exemplary embodiment of the present invention.

FIGS. 2A–C illustrate a micromechanical resonator consistent with one embodiment of the present invention. As shown in FIG. 2A, micromechanical resonator 20 includes resonant mass 22, substrate 26, electrode 28, and voltage source 29. Insulating layer 21 is only necessary if the range of motion of resonant mass 22 causes it to contact substrate 26. Resonant mass 22 is mounted on substrate 26, usually a silicon wafer although any other planar base material can be used. Resonant mass has fixed end 23 anchored to substrate 26 and free end 25. Electrode 28 is mounted in a fixed position relative to the free end of resonant mass 25. Alternatively, electrode 28 can be mounted on a moveable mechanism (not shown), so that its location can be tuned to match the equilibrium position of resonant mass 22. When residual stress in resonator 20, introduced during the fabrication process, causes the equilibrium position of free end 25 of resonant mass 22 to be located at a slight offset from its intended or true position, electrode 280 is preferably oversized and segmented as shown in FIG. 2B. This allows energizing of only the portion of the anchor that corresponds to the intended or true equilibrium position. These components are made using known micromachining techniques from materials known in the art.

Voltage source 29 applies a bias voltage between resonant mass 22 and electrode 28 to generate an electrostatic force therebetween. Resonant mass 22 can either be in an equilibrium position or vibrating at a low amplitude until it is subject to excitation by an event of interest. If the event of interest has a frequency component close to the resonant frequency of mass 22, free end 25 of resonant mass 22 oscillates at a higher amplitude in a direction substantially perpendicular to the plane of the substrate. Alternatively, as shown in FIG. 2C, resonator 22 can be configured so that the movement of free end 25 of the resonant member is parallel to the plane of substrate 26. In this case, anchor electrode 28 is preferably positioned either above or below resonant mass 22. This can be accomplished by, for example, placing anchor electrode 28 in another layer above or below resonant mass 22 rather than as a separate anchor structure. More preferably, anchor electrodes 28 are positioned above and below resonant mass 22.

Once the presence and amplitude of oscillation is measured by conventional means, free end 25 of resonant mass 22 is electrostatically damped by anchor electrode 28 by application of a bias voltage. Although the terms "damping" and "clamping" are used interchangeably, the electrostatic forces do not physically clamp resonant mass 22 or directly result in energy dissipation. Instead, the electrostatic forces dramatically increase the resonant frequency of resonant mass 22 causing it to move more quickly and therefore damp out vibrations faster from other intrinsic energy dissipation mechanisms, such as for example, atmospheric squeeze-film damping, resistive damping, and mechanical losses. Additionally, sensing electrodes 27 mounted on anchor electrode 28 may be used to capacitively sense the motion of resonant member 22. Optionally, these may be the same electrodes that are used to damp the resonator. The bias voltage required to damp resonant mass 22 depends on a number of factors including the mass of the resonator, the elastic properties of the resonator, and the amplitude of the oscillations. It is typically less than 300 V. Once damped, resonant mass 22 is returned to its equilibrium position and is ready for another measurement. By repeatedly damping and releasing resonant mass 22 the temporal range over which resonator 20 detects vibration can be broken up into discrete periods analogous to a short-time Fourier transform. Anchor electrode 28 is preferably positioned so that it releases resonant mass 22 in its equilibrium position, so resonant mass 22 is ready for another measurement. It will be apparent to those skilled in the art that anchor electrode 28 may be segmented into multiple smaller, individually actuated electrodes spaced along the range of motion of free end 25 of resonant mass 22. The voltage distribution to these individually activated electrodes may be selected so that the effect of energizing electrode 28 is to attract free end 25 to its equilibrium position. Optionally, this pattern of energizing electrode 28 may be derived automatically through sensing of the motion of resonant member 22. It addition, it will also be apparent to those skilled in the art that electrode 28 and member 22 may be segmented with fingers to provide additional surface area and more force to increase damping capability.

Sensing of the motion of free end 25 of resonant mass 22 may be coupled in a closed-loop manner to the voltage applied to anchor electrode 28. This coupling will allow an electrostatic attraction to be active when free end 25 of resonant member 22 is moving away from anchor electrode 28, thus, taking energy out of the system while allowing the electrostatic attraction to be inactive (V=0) when free end 22 is moving towards anchor electrode 28. The closed-loop control of voltage V enhances the ability of the system to stop the motion of free end 25 by preventing anchor electrode 28 from accelerating free end 25 during those portions of the vibration cycle when it is moving towards anchor electrode 28. This permits electrostatic attraction, as well as an increase in gaseous damping to decelerate free end 25 of resonant mass 22.

The present invention is not limited to a vibrating beam resonant mass as shown in FIGS. 2A–C. Resonator 20 may be, for example, proof mass structures, doubly fixed beams, or any other structure used in resonators.

Figure 3:
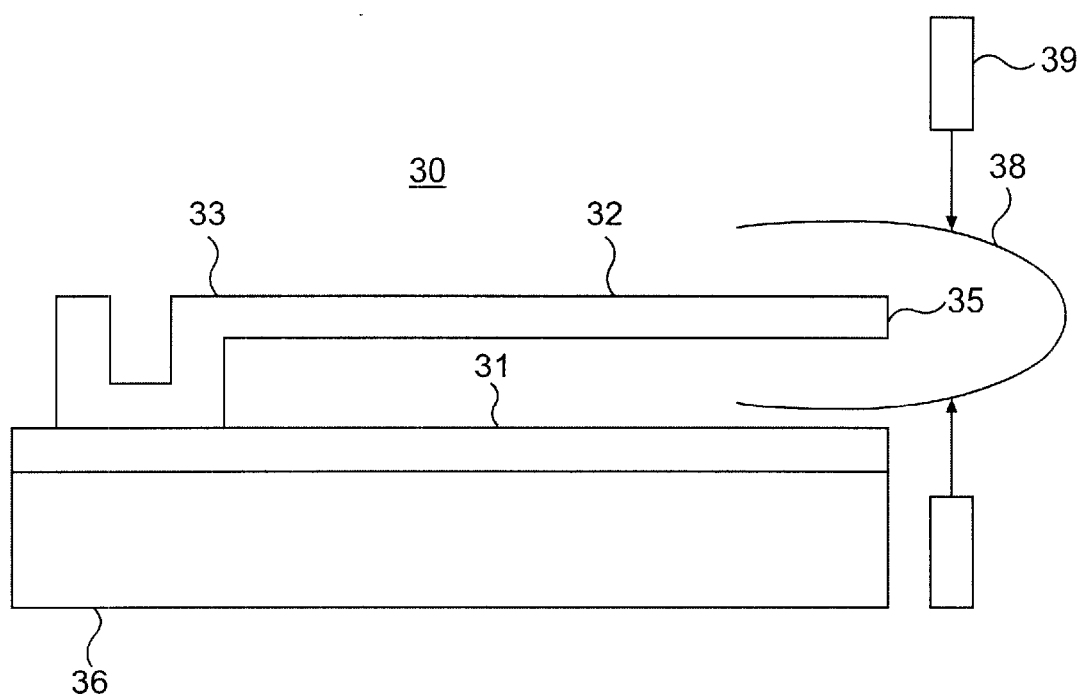

FIG. 3 illustrates a micromechanical resonator with a mechanical clamp consistent with another embodiment of the present invention. Micromechanical resonator 30 includes resonant mass 32, substrate 36, mechanical clamp 38, and actuator 39. Resonant mass 32 is attached to substrate 36. Substrate 36 is typically a silicon wafer, but can be any semiconductor base material. Resonant mass 32 is shown in FIG. 3 as a vibrating beam having a fixed end 33 and a free end 35. Other embodiments of the present invention include a resonant mass such as, for example, a proof mass, a doubly fixed beam or any other structure used in resonators.

Figure 4:
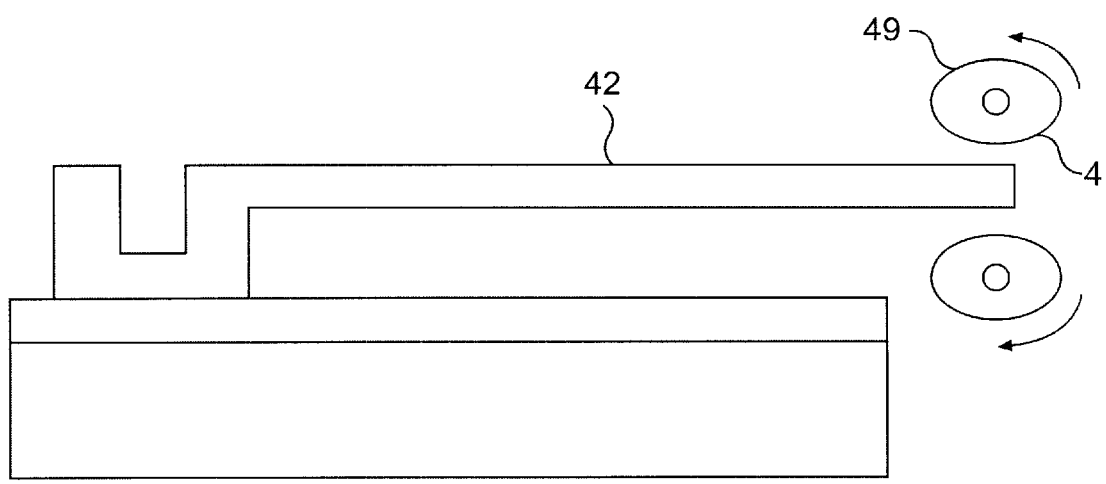
FIG. 4 is schematic side view of a micromechanical resonator with a elliptically shaped mechanical clamp and a rotary actuator according to one embodiment of the present invention.

Mechanical clamp 38 comprises an flexible material that is preferably viscoelastic, to absorb energy, and hydrophobic, to reduce stiction. Clamp 38 is, for example, the tri-block copolymer polyethylene-oxide-polypropylene-oxide-polyethylene-oxide. Alternatively, in engineering situations where a visco-elastic material is not suitable, and elastic material, such as a member of the siloxane family, e.g. polydimethylsiloxanes, may be employed. As with the other components, clamp 38 is made using known micromachining techniques. Actuator 39 and clamp 38 are preferably configured so that clamp 38 contacts resonant mass 32 at a point. This reduces problems with stiction. Actuator 39 is shown in FIG. 3 as a comb drive motor that moves clamp 38 into contact with resonant mass 32 when activated. Alternatively, clamp 48 is ellipse shaped and actuator 49 is rotary drive, As shown in FIG. 4, actuator 49 rotates clamp 48 so that it contacts resonant mass 42 at a point. Clamp 48 can also be a thermally activated clamp comprising a two-layer (bimorph) structure where one material had a greater coefficient of thermal expansion than the other material. When heated, one material expands more quickly than the other causing the clamping member to bend towards resonant mass 32.

Figure 5:
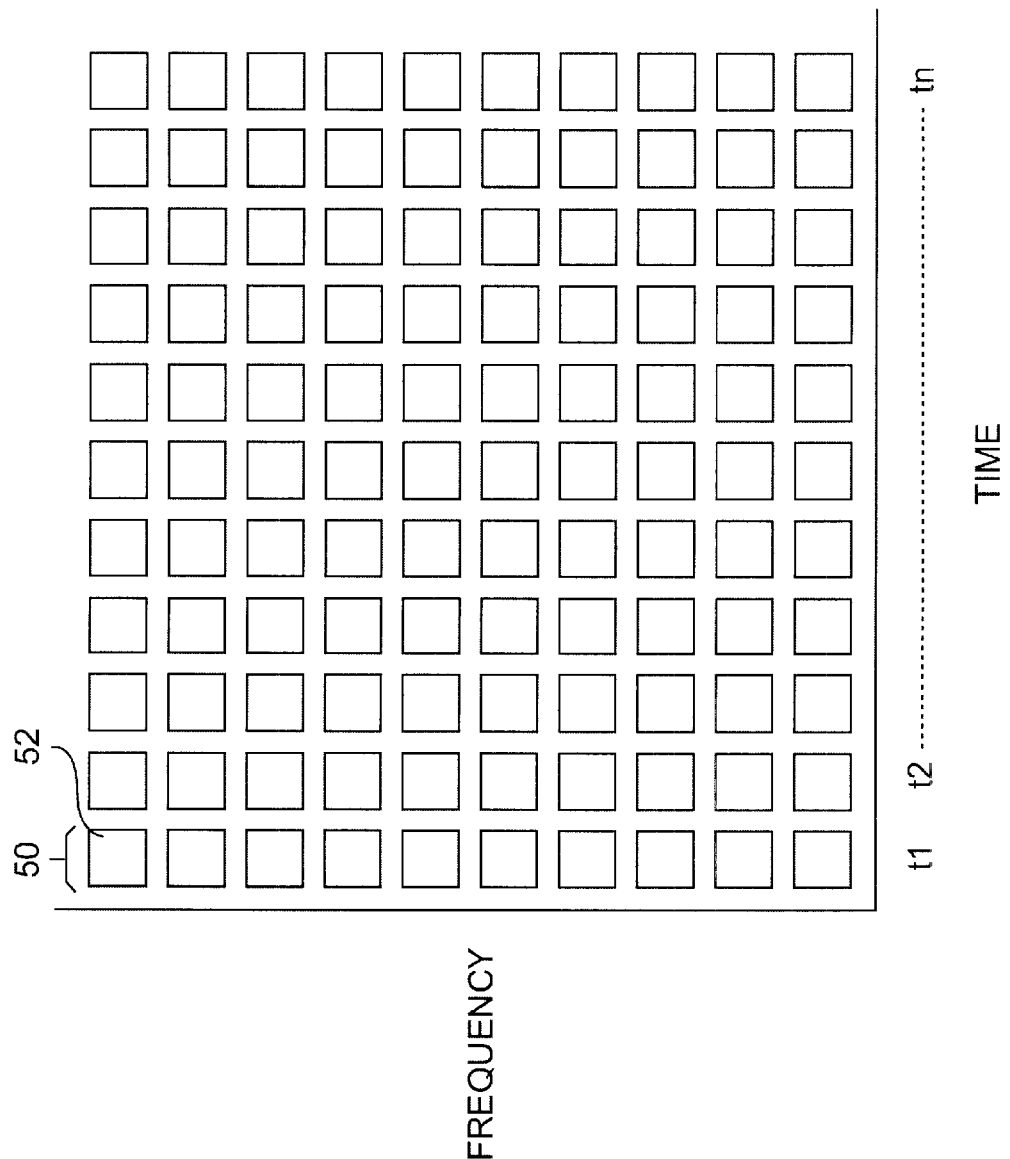
FIG. 5 is a schematic view showing an array of resonators which can detect signal components in both time and frequency domains.

In another embodiment consistent with the present invention, an array of micromechanical resonators produces a description of what frequencies are present in the signal during specific time intervals of interest. FIG. 5 shows how an array of resonators 50 comprising a plurality of resonators 52 can detect signal components in both time and frequency domains. Individual resonators preferably detect different frequencies over a desired frequency spectrum as represented by the vertical axis. Each of the plurality of resonators 52 further includes a clamping mechanism. Clamping mechanisms can be mechanical, electrostatic, or a combination of both types. After detection of the frequency components of the signal at a first discrete time interval $t_1$, clamping mechanisms reset each of the resonators by removing vibrations from the first time interval. Array 50 then measures the frequency components of the signal at a subsequent discrete time interval $t_2$. The clamping mechanisms continue to reset the resonators for subsequent measurements as desired to time interval $t_n$ where n is an integer and $t_n$ represents the $n^{th}$ time interval. In another embodiment, a plurality of arrays can be used to measure the time and frequency variations of a signal. In this embodiment, each array can be configured to measure the frequency components of a signal for different time intervals.

For signal analysis algorithms, such as time/frequency methods utilized in condition-based maintenance applications, the plurality of clamping mechanisms can be configured to simultaneously clamp the plurality of resonators 52 as shown in FIG. 5. In this manner, micromechanical resonator 50 detects the temporal and frequency variations of a signal.

For other condition-based algorithms, such as wavelet transformation, the plurality of clamping mechanisms can be configured to provide a hierarchy of time intervals between damping. The hierarchy of time intervals can be realized by activating the clamping mechanisms at the end of preset time intervals. The time intervals could be measured by electronic or mechanical counters. The configuration preferably includes multiple resonators detecting the same frequency during time intervals of varying duration.

It will be apparent to those skilled in the art that various modifications and variations can be made in the micromechanical resonators including clamping mechanisms of the present invention without departing from the spirit or scope of the invention. Thus, it is intended that the present invention cover the modifications and variations of this invention provided they come within the scope of the appended claims and their equivalents.

What is claimed is:

1. A micromechanical resonator comprising:
   at least one resonant mass having an equilibrium position;
   at least one anchor electrode that provides electrostatic damping of the resonant mass;
   at least one sensor that detects amplitude of a first oscillation of the resonant mass at a first time interval, wherein the at least one anchor electrode damps the resonant mass after the at least one sensor detects amplitude of the first oscillation to provide a second time interval for detecting amplitude of a second oscillation; and
   a substrate.

2. The micromechanical resonator of claim 1, wherein the electrode is oversized and segmented.

3. The micromechanical resonator of claim 1, wherein the anchor electrode is moveable.

4. The micromechanical resonator of claim 1, wherein the anchor electrode releases the resonant mass in its equilibrium position.

5. The micromechanical resonator of claim 1, wherein at least one sensing electrode is mounted on the anchor electrode to sense the motion of the resonant mass.

6. The micromechanical resonator of claim 5, wherein the anchor electrode acts as a sensing electrode to sense the motion of the resonant mass.

7. The micromechanical resonator of claim 1, further comprising a closed-loop control of a voltage of the anchor electrode.

8. The micromechanical resonator of claim 1, wherein the anchor electrode is segmented into individually actuated electrodes.

9. The micromechanical resonator of claim 2, wherein each segment of the segmented electrode is individually actuated in a pattern to attract the resonant mass.

10. The micromechanical resonator of claim 1, wherein a free end of the resonant mass vibrates in a direction parallel to the substrate.

11. The micromechanical resonator of claim 1, further comprising a plurality of resonant masses and a plurality of anchor electrodes.

12. An array of micromechanical resonators comprising a plurality of resonant masses and a plurality of mechanisms to damp the resonant masses, wherein the damping mechanisms are simultaneously activated to allow the array to measure discrete time intervals.

13. A plurality of arrays of micromechanical resonators, wherein each array comprises a plurality of resonant masses each having a different resonant frequency and a plurality of mechanisms to simultaneously damp the resonant masses of each array to allow measurement to be taken during discrete time intervals.

14. A micromechanical resonator comprising:
   at least one resonant mass having an equilibrium position;
   a clamp, wherein the clamp provides mechanical clamping of the resonant mass;

at least one sensor that detects an amplitude of a first oscillation of the resonant mass at a first time interval, wherein the clamp clamps the resonant mass after the at least one sensor detects the amplitude of the first oscillation to provide a second time interval for detecting an amplitude of a second oscillation; and a actuator for applying the clamp.

15. The micromechanical resonator of claim 14, wherein the clamp comprises an elastomeric material.

16. The micromechanical resonator of claim 14, wherein the clamp comprises a hydrophobic material.

17. The micromechanical resonator of claim 14, wherein the clamp comprises a viscoelastic material.

18. The micromechanical resonator of claim 14, wherein the clamp comprises a flexible structure.

19. The micromechanical resonator of claim 14, wherein the actuator is actuated electrostatically, thermally, magnetically, or piezoelectrically.

20. The micromechanical resonator of claim 14, further comprising a plurality of clamps and a plurality of resonant masses.

21. An array of micromechanical resonators comprising a plurality of resonant masses and a plurality of clamps to clamp the resonant masses, wherein the clamps are configured to allow the array to measure a hierarchy of time intervals.

22. The array of micromechanical resonators of claim 21, wherein the clamps are configured so that multiple resonators detect a frequency during time intervals of varying duration.

23. A plurality of arrays of micromechanical resonators, wherein each array comprises a plurality of resonant masses and a plurality of clamps to clamp the resonant masses of each array to allow hierarchical measurement of a plurality of time intervals.

24. A method for detecting time and frequency content of a plurality of events comprising:

determining the frequency content of a first event during an initial time interval by detecting oscillation of the plurality of resonant masses, wherein at least two of the plurality of resonant masses has a different resonant frequency and each of the plurality of resonant masses has a fixed portion, a free portion, and an equilibrium position;

clamping the free ends of the resonant masses; and releasing the resonant masses in their equilibrium positions to provide a second time interval to measure the frequency content of a second event.

25. The method of claim 24, wherein the clamp electrostatically clamps and releases the resonant mass.

26. The method of claim 24, wherein the clamp mechanically clamps and releases the resonant mass.

\* \* \* \* \*